(12) United States Patent
Mohn et al.

(10) Patent No.: US 11,189,556 B2
(45) Date of Patent: Nov. 30, 2021

(54) MANUFACTURING OF A POWER SEMICONDUCTOR MODULE

(71) Applicants: ABB Schweiz AG, Baden (CH); Audi AG, Ingolstadt (DE)

(72) Inventors: Fabian Mohn, Ennetbaden (CH); Chunlei Liu, Oberrohrdorf (CH); Jürgen Schuderer, Zürich (CH)

(73) Assignees: ABB Power Grids Switzerland AG, Baden (CH); AUDI AG, Ingolstadt (DE)

( * ) Notice: Subject to any disclaimer, the term of this patent is extended or adjusted under 35 U.S.C. 154(b) by 0 days.

(21) Appl. No.: 16/419,668

(22) Filed: May 22, 2019

(65) Prior Publication Data

US 2019/0273040 A1 Sep. 5, 2019

Related U.S. Application Data

(63) Continuation of application No. PCT/EP2017/080248, filed on Nov. 23, 2017.

(30) Foreign Application Priority Data

Nov. 23, 2016 (EP) ..................................... 16200329

(51) Int. Cl.
*H01L 23/498* (2006.01)
*H01L 21/48* (2006.01)
(Continued)

(52) U.S. Cl.
CPC .... *H01L 23/49861* (2013.01); *H01L 21/4839* (2013.01); *H01L 21/565* (2013.01);
(Continued)

(58) Field of Classification Search
CPC .................................................. H01L 23/49537
See application file for complete search history.

(56) References Cited

U.S. PATENT DOCUMENTS

| 5,339,518 A | * | 8/1994 | Tran | H01L 21/4821 |
|---|---|---|---|---|
| | | | | 257/E23.042 |
| 5,535,509 A | * | 7/1996 | Tomita | H01L 21/565 |
| | | | | 29/827 |

(Continued)

FOREIGN PATENT DOCUMENTS

| DE | 19625240 A1 | 4/1997 |
|---|---|---|
| EP | 0767494 A2 | 4/1997 |

(Continued)

OTHER PUBLICATIONS

European Patent Office, International Search Report & Written Opinion issued in corresponding Application No. PCT/EP2017/080248, dated Jan. 31, 2018, 9 pp.

(Continued)

*Primary Examiner* — David A Zarneke
(74) *Attorney, Agent, or Firm* — Slater Matsil, LLP

(57) ABSTRACT

A semi-manufactured power semiconductor module includes a substrate for bonding at least one power semiconductor chip; a first leadframe bonded to the substrate and providing power terminals; and a second leadframe bonded to the substrate and providing auxiliary terminals; wherein the first leadframe and/or the second leadframe include an interlocking element adapted for aligning the first leadframe and the second leadframe with respect to each other and/or with respect to a mold for molding an encapsulation around the substrate, the first leadframe and the second leadframe.

25 Claims, 5 Drawing Sheets

(51) Int. Cl.
 *H01L 21/56* (2006.01)
 *H01L 23/31* (2006.01)
 *H01L 23/495* (2006.01)

(52) U.S. Cl.
 CPC .... *H01L 23/3121* (2013.01); *H01L 23/49537* (2013.01); *H01L 23/49541* (2013.01); *H01L 23/49838* (2013.01); *H01L 23/49555* (2013.01); *H01L 23/49844* (2013.01)

(56) References Cited

U.S. PATENT DOCUMENTS

| | | | |
|---|---|---|---|
| 5,767,573 A | 6/1998 | Noda et al. | |
| 5,792,676 A | 8/1998 | Masumoto et al. | |
| 6,072,228 A * | 6/2000 | Hinkle | H01L 23/49503 |
| | | | 257/666 |
| 6,713,317 B2 * | 3/2004 | Knapp | H01L 23/3107 |
| | | | 257/E23.042 |
| 7,902,660 B1 | 3/2011 | Lee et al. | |
| 8,513,784 B2 * | 8/2013 | Lu | H01L 24/84 |
| | | | 257/666 |
| 8,698,288 B1 * | 4/2014 | Low | H01L 24/11 |
| | | | 257/668 |
| 9,030,003 B2 * | 5/2015 | Minamio | H01L 23/4334 |
| | | | 257/706 |
| 9,265,144 B2 * | 2/2016 | Minamio | H01L 23/49575 |
| 10,192,818 B2 * | 1/2019 | Simakawa | H01L 23/49861 |
| 10,312,184 B2 * | 6/2019 | Joshi | H01L 21/4828 |
| 11,056,462 B2 * | 7/2021 | Lee | H01L 23/49537 |
| 2004/0150077 A1 | 8/2004 | Fujita | |
| 2010/0133670 A1 * | 6/2010 | Liu | H01L 23/49524 |
| | | | 257/675 |
| 2012/0133034 A1 * | 5/2012 | Imura | H01L 21/4842 |
| | | | 257/666 |
| 2013/0010442 A1 | 1/2013 | Heim et al. | |
| 2014/0159054 A1 | 6/2014 | Otake et al. | |
| 2015/0060123 A1 * | 3/2015 | Lee | H01L 23/49555 |
| | | | 174/261 |
| 2017/0103904 A1 * | 4/2017 | Nguyen | H01L 21/565 |
| 2017/0309554 A1 * | 10/2017 | Mangrum | H01L 23/49537 |
| 2018/0012828 A1 * | 1/2018 | Beer | H01L 24/97 |
| 2019/0181076 A1 * | 6/2019 | Vitello | B26F 1/38 |
| 2019/0206773 A1 * | 7/2019 | Razon, III | H01L 24/33 |
| 2020/0058575 A1 * | 2/2020 | Proepper | H01L 23/49562 |

FOREIGN PATENT DOCUMENTS

| | | |
|---|---|---|
| EP | 2548423 B1 | 1/2013 |
| EP | 3079170 A1 | 10/2016 |
| FR | 2740610 A1 | 4/1997 |
| JP | H09102571 A | 4/1997 |
| JP | H09129822 A | 5/1997 |
| JP | 2002141453 A | 5/2002 |
| JP | 2014049584 A | 3/2014 |
| WO | 2015083263 A1 | 6/2015 |

OTHER PUBLICATIONS

Haumann, Siegbert, et al., "Novel Binding and Joining Technology for Power Electronics", 2013 Twenty-Eighth Annual IEEE Applied Power Electronics Conference and Exposition (APEC), Long Beach, CA, USA, Mar. 17-21, 2013, pp. 622-626.

Notice of Reasons for Refusal, issued in Japanese Patent Application No. 2019-547784, dated Jul. 28, 2021, 14 total pages.

* cited by examiner

MANUFACTURING OF A POWER SEMICONDUCTOR MODULE

FIELD OF THE INVENTION

The invention relates to the field of manufacturing of power semiconductor modules. In particular, the invention relates to a semi-manufactured power semiconductor module, a power semiconductor module and a method for manufacturing a power semiconductor module.

BACKGROUND OF THE INVENTION

Power semiconductor modules containing solid-state semiconductor switches, such as IGBTs or Power-MOS-FETs, are used in various power electronics applications to switch or rectify electric currents. An important and fast growing application are converter systems for electric or hybrid electric vehicles. A typical six-pack module for such applications may have a voltage rating of up to 1200 V and a current rating of several hundred amperes.

Besides the high-current power terminals by which the power semiconductor module is connected to an AC side (e.g. motor) and a DC side (e.g. battery), such power semiconductor modules also usually have several auxiliary terminals for example for a connection to a gate driver circuit board, which controls the semiconductor switches in the power semiconductor module and/or which detects fault situations. A typical six-pack power semiconductor module may have up to ten such auxiliary terminals per half-bridge, that is, 30 auxiliary terminals.

Technologies commonly used for auxiliary terminals are screw connections, solder pin connections and press-fit connections. Press-fit connection technology is an often used solution especially in the automotive industry due to its attractive properties such as high reliability, high-temperature capability and ease of assembly. For example, press-fit connections may be used for attachment of a circuit board to the power semiconductor module.

Another solution especially for automotive power semiconductor modules is an epoxy mold encapsulation, which can have benefits compared to an encapsulation and potting approach for example in terms of high-temperature capability, humidity resistance, cost, and high-volume manufacturability. Unfortunately, the commonly used epoxy molding process for such an encapsulation, i.e. transfer molding, is usually not compatible with pins sticking out vertically from the power semiconductor module. Transfer-molded power semiconductor modules are therefore only available with lead-frame terminals for power and auxiliary connections on the side of the power semiconductor module. The power and auxiliary terminals are usually formed by a single leadframe part.

EP 2 548 423 B1 shows a leadframe structure with multiple vertically stacked conducting layers.

EP 3 079 170 A1 relates to a lead frame, a mold and a method for manufacturing the lead frame, which is composed of two metal plates that may be made of copper and of bronze material. The metal plates are interlocked with each other. A mold is used for pressing onto the interlocking elements.

US 2014/159054 A1 discloses a semiconductor module with power terminals and auxiliary terminals having different thickness.

DESCRIPTION OF THE INVENTION

When all terminals of a power semiconductor module are provided by one leadframe, usually only auxiliary terminals that are soldered in the gate driver circuit board may be used, because press-fit terminals require harder materials, which on the other hand are not desired for the power terminals because of the lower electrical conductivity and higher material cost.

It is an objective of the invention to combine press-fit auxiliary terminals with a transfer-molded encapsulation. It is a further objective of the invention to provide an economical and simple manufacturing process for a power semiconductor module.

These objectives are achieved by the subject-matter of the independent claims. Further exemplary embodiments are evident from the dependent claims and the following description.

A first aspect of the invention relates to a semi-manufactured power semiconductor module. A semi-manufactured power semiconductor module may be a member, which after further processing steps can be transformed into a fully functioning power semiconductor module.

According to an embodiment of the invention, the semi-manufactured power semiconductor module comprises a substrate for bonding at least one power semiconductor chip; a first leadframe bonded to the substrate and providing power terminals and a second leadframe bonded to the substrate and providing auxiliary terminals. The substrate may be an electrically isolating substrate, which is provided with one or two structured metallization layers onto which the one or more chips may be bonded. Also the first and second leadframe may be bonded to the metallization layer. Furthermore, the first leadframe and the second leadframe have a different thickness.

The first leadframe and/or the second leadframe comprise an interlocking element adapted for aligning and/or fixating the first leadframe and/or the second leadframe with respect to each other and/or with respect to a mold for molding an encapsulation around the substrate and the first and the second leadframe.

In order to provide a transfer-moldable semi-manufactured power semiconductor module with terminals for power and auxiliary connections, the leadframe structure is split into separate parts for power terminals and auxiliary terminals, i.e. the first leadframe and the second leadframe, which may be made of different materials and/or may have different thicknesses. The interlocking element may stabilize the first and second leadframe with respect to each other for bonding and/or before molding. Furthermore, with the interlocking element, the first and second leadframe are made compatible with a transfer molding process, in particular with respect to sealing of the volume that is to be filled with the molding material.

The semi-manufactured power semiconductor module may be molded into an encapsulation and after that, optionally the one or more interlocking elements may be removed for forming the final power semiconductor module.

With the semi-manufactured power semiconductor module, a very cost effective manufacturing process may be established, because transfer mold encapsulation is a cost-effective process for volume production. Furthermore, the first and second leadframe may be stamped from metal sheets, which is also a cheap process to produce in large volume.

It should be mentioned, that the first and second leadframe may be flat members or that at least one of the first and second leadframe may be 3D-shaped. For example, at least one of the leadframes may have an elbow structure to reduce stresses during the welding process. The elbow structure may interconnect a welding point and a terminal.

According to an embodiment of the invention, the first leadframe has a first interlocking element and the second leadframe has a second interlocking element form fitting into the first interlocking element. With these two interlocking elements, the first and second leadframe may be fixed to each other. By providing an interlocking structure between separate leadframes, these leadframes may be made from different materials and/or may have different thicknesses. The entire leadframe structure, i.e. the interlocked first and second leadframe, may still be assembled and bonded to the substrate with high precision such that the requirements of the transfer molding process may be met.

According to an embodiment of the invention, one of the interlocking elements has a broadened tip and the other one of the interlocking elements has an equally shaped opening. For example, the interlocking elements for interlocking different leadframes may be shaped as a jigsaw puzzle. It has to be noted that the interlocking element of a leadframe may be one-piece with the leadframe and/or may be stamped together with the leadframe from the same metal sheet.

According to an embodiment of the invention, the first leadframe comprises a holding element surrounding the second leadframe and an interlocking element is provided by the holding element. For example, the holding element may be a rectangular frame, to which all parts of the first leadframe, such as the power terminals, dams (see below), etc. are connected. The second leadframe may be linked into this holding element with the aid of one or more interlocking elements.

According to an embodiment of the invention, an interlocking element of the first leadframe and/or an interlocking element of the second leadframe is adapted for being arranged in a corresponding interlocking part of the mold. It may be that one or more interlocking elements are used for positioning the first and/or second leadframe in a half of the mold. For example, the interlocking element may have a broadened tip and the interlocking part of the mold may have an equally shaped opening.

According to an embodiment of the invention, the interlocking element is provided on a side of a power terminal and/or an auxiliary terminal. The one or more interlocking elements may be provided at a position of the leadframe, which stays outside of the encapsulation formed by molding. In such a way, the interlocking elements may be removed after molding.

According to an embodiment of the invention, interlocking elements of the first leadframe and the second leadframe are arranged on a line. This line may be positioned that the interlocking elements are covered by a border of the mold. The mold may have two halves, which, when closed, form a volume in which the substrate and inner parts of the leadframes are accommodated. This volume is surrounded by the border of the mold. During molding, this volume is filled with a molding material under pressure. The interlocking features provide a seal for the molding material, which prevents the liquid molding material from leaving the volume.

According to an embodiment of the invention, the first leadframe and/or the second leadframe comprises a dam element interconnecting the terminals. The dam element is provided at a position, such that it is covered by a border of the mold, when the encapsulation is molded. A dam element may interconnect several terminals with each other and/or may be positioned that it may be removed from the terminals after molding. The one or more dam elements prevent the molding material from leaving the volume of the mold during molding.

According to an embodiment of the invention, interlocking elements of the first leadframe and the second leadframe are provided on a line with the dam element and/or are parts of the dam element. The dam elements together with the interlocking elements may provide a seal for the mold volume. By pressing with the two halves of the mold on the one or more dam elements and the interlocking elements, a hermetic sealing of the mold volume may be achieved. For example, the interlocking features may only have a gap between them with a width of only 0.05 mm to 0.1 mm, which may be tolerable for the transfer molding process.

According to an embodiment of the invention, the first leadframe and the second leadframe are made of a different material. The first and/or second leadframe also may be provided with a plating. The first leadframe with power terminals and the second leadframe with auxiliary terminals may be optimized separately regarding material properties, thickness and/or plating. In particular, the first leadframe may be made of Cu and may be thicker than the second leadframe, such that thick Cu terminals with high electrical conductivity are provided as power terminals, which may be, for example, resistance-welded to external busbars. The second leadframe may be made of a harder alloy such as CuNiSi and may be made thinner as the second leadframe, such that thinner and harder terminals are provided as auxiliary terminals, which may be inserted into a gate driver circuit board, for example using Sn-plated press-fit pins.

For example, the thickness of the second leadframe and the auxiliary terminals may have a thickness in the range of 0.6 mm to 0.8 mm. Depending on the targeted current rating, a first leadframe and power terminals in the range of 1.0 mm to 1.5 mm thickness may be required.

It has to be noted that the thickness of a leadframe or a terminal may be measured with respect to a direction orthogonal to an extension of the substrate of the power semiconductor module.

According to an embodiment of the invention, the first leadframe is made from one metal sheet and/or the second leadframe is made from one metal sheet. Each of the leadframes may be one-piece until the interlocking features, dams or holding elements are removed. For example, the leadframes may be made by stamping.

According to an embodiment of the invention, at least some of the auxiliary terminals have a press-fit tip. A press-fit terminal may comprise a pin with a deformable tip. The tip may be inserted with force into a through-hole, for example in a circuit board to form a hermetic and permanent electrical connection. The tip may be Sn-plated.

This may enable a combination of an epoxy mold encapsulation and a press-fit interconnection, which are both preferred technologies for applications with demanding temperature, load cycling, and/or vibration requirements, such as for example inverters for (hybrid) electric vehicles.

A further aspect of the invention relates to a power semiconductor module, which may be manufactured from the semi-manufactured power semiconductor module. For example, the power semiconductor module may be used in automotive applications, such as electric vehicles, hybrid vehicles, motorbikes, busses, trucks, off-road construction vehicles and charging stations. The term "power" may refer to modules and/or chips adapted for processing voltages of more than 100 V and/or more than 10 A.

According to an embodiment of the invention, the power semiconductor module comprises a substrate onto which at least one power semiconductor chip is bonded; a molded encapsulation, into which the substrate is embedded; first leadframe parts bonded to the substrate and providing power terminals protruding from the encapsulation and second leadframe parts bonded to the substrate and providing auxiliary terminals protruding from the encapsulation. The first and second leadframe parts are made from the first and second leadframe after removing of the interlocking elements, dam elements, holding elements, etc. The first leadframe parts and the second leadframe parts are made of a different material and/or have different thicknesses orthogonal to an extension direction of the substrate.

A further aspect of the invention relates to a method for manufacturing a power semiconductor module. It has to be understood that features of the method as described in the above and in the following may be features of the (semi-manufactured) power semiconductor module as described in the above and in the following, and vice versa.

According to an embodiment of the invention, the method comprises: providing a substrate for bonding at least one power semiconductor chip; bonding a first leadframe and a second leadframe to the substrate, wherein the first leadframe and/or the second leadframe comprise an interlocking element adapted for aligning and/or fixating the first leadframe and/or the second leadframe with respect to each other and/or with respect to a mold; placing the substrate, the first leadframe and the second leadframe in a mold, such that the interlocking element is positioned on a border of the mold; and molding the substrate, the first leadframe and the second leadframe into a molding material, wherein liquid molding material is hindered by the interlocking element from leaving, i.e. flowing through the border, of the mold.

Before the molding, one or more chips may be bonded to the substrate, for example, by soldering, sintering, etc. Furthermore, the two leadframes may be bonded to the substrate, for example, by soldering, sintering, ultrasonic welding, etc. During bonding, the two leadframes may be fixated with respect to each other by two interlocked interlocking elements provided on different leadframes.

Alternately or additionally, during the bonding of the leadframes, a fixture similar to the bottom half of the mold, which also comprises one or more interlocking elements like the bottom half of the mold, may be used to arrange the leadframes.

When an ultrasonic welding process is used for the bonding of the leadframes, only an interlocking of the leadframes with the fixture may have the additional advantage that a mechanical decoupling between different terminal parts is provided by the fixture. This may reduce damping of the ultrasound power by vibrational losses that may be a problem if different leadframes are in direct contact to each other.

After the bonding, the assembled semi-manufactured power semiconductor module is arranged in a mold. When the two halves of the mold are pressed on the leadframe, a hermetic seal may be built at the border of the mold, which is provided by the interlocking elements and/or dam elements. In the hermetically sealed volume, the molding material, such as an epoxy compound, may be pressed.

According to an embodiment of the invention, the mold has a first mold half and a second mold half, wherein the first mold half has a border providing an interlocking part for accommodating the interlocking element. Furthermore, the border may have different heights, for compensating different thicknesses of the first leadframe and the second leadframe. The border may have beveled parts, which have heights corresponding to the thickness of the different leadframes. In their ends, the beveled parts may have openings (i.e. interlocking parts) corresponding to interlocking elements of the leadframes. The semi-manufactured power semiconductor module may be placed in the mold half, such that the interlocking elements are placed in these openings. The interlocking elements, the interlocking parts, the beveled parts of the border, optional dam elements and/or holding elements may form the hermetic seal surrounding the border of the mold.

According to an embodiment of the invention, the method further comprises: removing the interlocking element from the first leadframe and/or the second leadframe after molding. After the molding, also the dam elements and/or the holding element may be removed.

There are further possibilities, how a semiconductor module described above and below may be manufactured.

A further embodiment of a semi-manufactured power semiconductor module comprises a substrate for bonding at least one power semiconductor chip; a first leadframe bonded to the substrate and providing power terminals; a second leadframe bonded to the substrate and providing auxiliary terminals; wherein the first leadframe has a first fork element pointing towards a second fork element of the second leadframe, such that an opening between the first fork element and the second fork element is generated.

The fork elements may accommodate an elastic sealing element between them, which during molding provides a seal on the border of the mold between the different leadframes.

The first leadframe and the second leadframe of this embodiment also may be made of different materials and/or may have different thicknesses. Furthermore, they may have the features as described above and below (such as dam elements, a holding element, etc.). The fork elements also may be arranged like the locking elements (such as on a border of a terminal, on a line, etc.).

A further embodiment of a method for manufacturing a power semiconductor module comprises: providing a substrate for bonding at least one power semiconductor chip; bonding a first leadframe and a second leadframe to the substrate, wherein the first leadframe has a first fork element pointing towards a second fork element of the second leadframe, such that an opening between the first fork element and the second fork element is generated; placing the substrate, the first leadframe and the second leadframe in a mold, such that the first fork element and the second fork element are positioned on a border of the mold and such that a sealing element of the mold is positioned inside the opening; and molding the substrate, the first leadframe and the second leadframe into a molding material, wherein liquid molding material is hindered by the compressed sealing element from leaving the mold.

The sealing element may be made from a compressive material, which may be inserted between the at least two leadframe parts during the molding process. The compressive sealing element may be made of any elastic material that can withstand repetitive high temperature and elastic loading, as for example PTFE or silicone rubber. The sealing element may be a block, which may be inserted between neighboring dam elements in one of the molds. Two different leadframes may then be fixed by the sealing element that gets compressed when the mold closes and in this way seals the volume of the mold.

Also the border of this mold may have different heights, for compensating different thicknesses of the first leadframe and the second leadframe.

These and other aspects of the invention will be apparent from and elucidated with reference to the embodiments described hereinafter.

BRIEF DESCRIPTION OF THE DRAWINGS

The subject matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
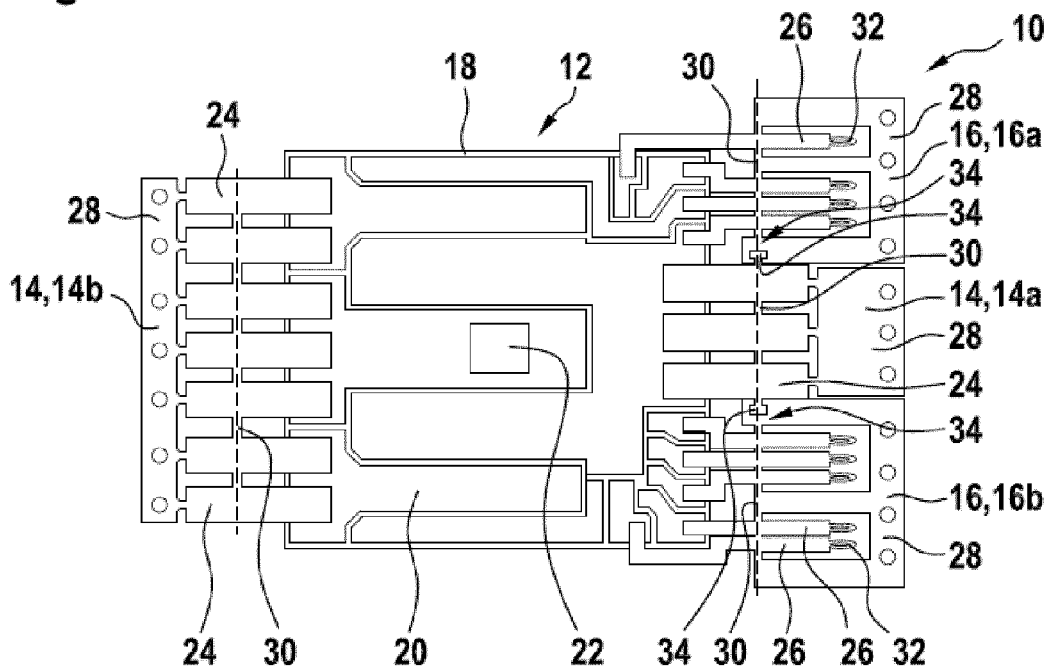
FIG. 1 shows a top view of a semi-manufactured power semiconductor module according to an embodiment of the invention.

FIG. 1 shows a semi-manufactured power semiconductor module 10, which comprises a substrate 12, onto which several leadframes 14, 16 are bonded.

The substrate 12, which is substantially rectangular, comprises an isolating base layer 18, for example from ceramics. On the base layer 18, a structured metallization layer 20 is provided, which, for example, may be a Cu layer. One or more semiconductor chips 22 may be bonded to the metallization layer 20.

The module 10 comprises two leadframes 14a, 14b with power terminals 24 and two auxiliary leadframes 16a, 16b with auxiliary terminals 26. The leadframes 14a, 14b, 16a, 16b are all bonded to the metallization layer 20.

All the leadframes 14a, 14b, 16a, 16b comprise a holding element 28 and a dam element 30, which interconnect the terminals 24, 26 with each other. The holding element 28 may comprise holes and/or may be used for positioning the respective leadframe 14a, 14b, 16a, 16b with respect to the substrate 12, when the leadframe 14a, 14b, 16a, 16b is bonded to the substrate 12.

Also the dam element 30 interconnects the respective terminals 24, 26 of one leadframe 14a, 14b, 16a, 16b with each other. However, the dam element 30 is positioned at an intermediate part of the terminals 24, 26 such that a dam between the terminals 24, 26 is provided, which hinders molding material from flowing out of a mold (see below).

Contrary to this, the holding element 28 of the leadframe terminals 24, 26 is positioned outside of the tips of the respective terminals 24, 26.

The leadframes 14a, 14b may be made of Cu. The leadframes 16a, 16b may be made of CuNiSi, i.e. a harder material than Cu. Furthermore, the leadframes 14a, 14b may be thicker than the leadframes 16a, 16b. In such a way, the auxiliary terminals 26 may be made of a material that is adapted for forming a press-fit tip 32, as shown in FIG. 1. On the other hand, the power terminals 24 may be adapted for conducting large currents with low losses.

In FIG. 1, one leadframe 14b is positioned on a first side of the module 10, the other three leadframes 14a, 16a, 16b are positioned on a second, opposite side of the module 10. The leadframe 14a with power terminals 24 is interpositioned between the two leadframes 16a, 16b with auxiliary terminals 26.

In FIG. 1, the dashed lines indicate a sealing of a mold volume of a mold. Two halves of a mold will be positioned with its border on the dashed lines to close the mold volume. The dam elements 30 of the leadframes form dams that are positioned at the border of the mold to prevent leakage of mold material from the mold volume, such as epoxy mold compound.

The dam elements 30 of the leadframes 14a, 16a, 16b on the second side are aligned in one line and form together the dam on the second side of the module 10. Where the dam elements 30 of two leadframes 14a, 16a, 16b meet, the leadframes are provided with an interlocking element 34. The interlocking elements 34 are provided on a side at an intermediate part of the terminals 24, 26. The interlocking elements 34 of two leadframes 14a, 16a, 16b engage each other like jigsaw pieces to improve the connection between the leadframes 14a, 16a, 16b and to reduce a leakage of mold material. In particular, an increased slot length around the jigsaw feature will help to reduce this risk.

In general, an interlocking element 34 may have a broadened tip, while the corresponding interlocking element 34 has an equally shaped opening. In FIG. 1, the interlocking elements 34 with the broadened tip are provided by the leadframe 14a and the interlocking elements 34 with an opening are provided by the leadframes 16a, 16b. However, this also may be the other way round.

Figure 2:
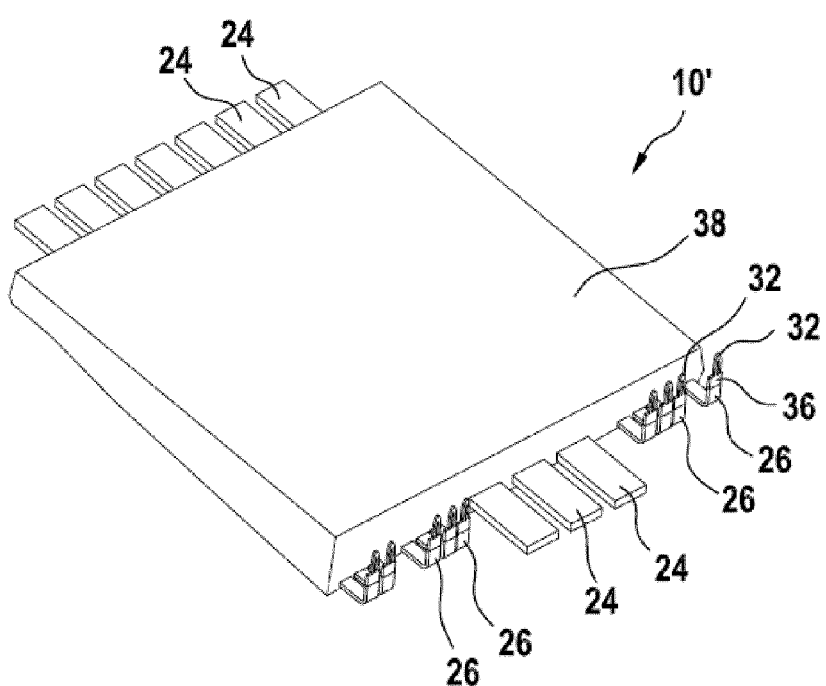
FIG. 2 shows a perspective view of a power semiconductor module according to an embodiment of the invention.

FIG. 2 shows a power semiconductor module 10' that was made based on the semi-manufactured power semiconductor module 10.

The power semiconductor module 10' comprises a molded encapsulation 38, which surrounds the substrate 12 with the one or more chips 22. From the encapsulation 38, the terminals 24, 26 protrude from two opposite sides. The power terminals 26 may be Cu power terminals, which are thicker than the auxiliary terminal 26 (orthogonal to an extension direction of the encapsulation 38). The auxiliary terminals 26 may be CuNiSi terminals and/or may comprise press-fit tips 32. The press-fit tips 32 may comprise a plating 36, for example made of Sn. Furthermore, the auxiliary terminals 26 and/or the press-fit tips 32 may be bent upwards or downwards (more general orthogonal to extension direction of the encapsulation 38) for press-fit connection to a gate driver circuit board.

The power semiconductor module 10' may be made in the following way:

In a first step, a substrate 12 may be provided, onto which the one or more power semiconductor chips 22 and the leadframes 14a, 14b, 16a, 16b are bonded. Before the bonding, the leadframes 14a, 16a, 16b may be interlocked with each other via the interlocking element 34.

In a second step, the substrate 12 and the bonded leadframes 14, 16 are placed in a mold, such that the dam elements 30 and the interlocking elements 34 are positioned on a border of a first mold half. A second mold half is positioned on the first mold half, such that a substantially hermetically sealed mold volume is generated, in which the substrate 12 and the inner part of the leadframes 14, 16 are arranged. Molding material is inserted under pressure into the mold volume and the substrate 12 and the leadframes are molded into the encapsulation 38. During the molding, liquid molding material is hindered by the dams and interlocking elements 34 from leaving the mold on the side.

In a third step, the module 10 is removed from the mold. After that, the interlocking elements 34, dam elements 30 and holding elements 28, which are outside of the encapsulation 38, are removed from the terminals 24, 26. For example, the elements 34, 28, 30 may be removed by stamping. Also, the auxiliary terminals 26 may be bent, such that their tips protrude to an upside of the module 10.

With respect to FIG. 1, the assembly and alignment of the three leadframes 14a, 16a, 16b on one side of the substrate 12 may be improved by the interlocking elements 34. However, a required relative alignment tolerance to the leadframe 14b on the other side of the substrate 12 may still be difficult to achieve.

Figure 3:
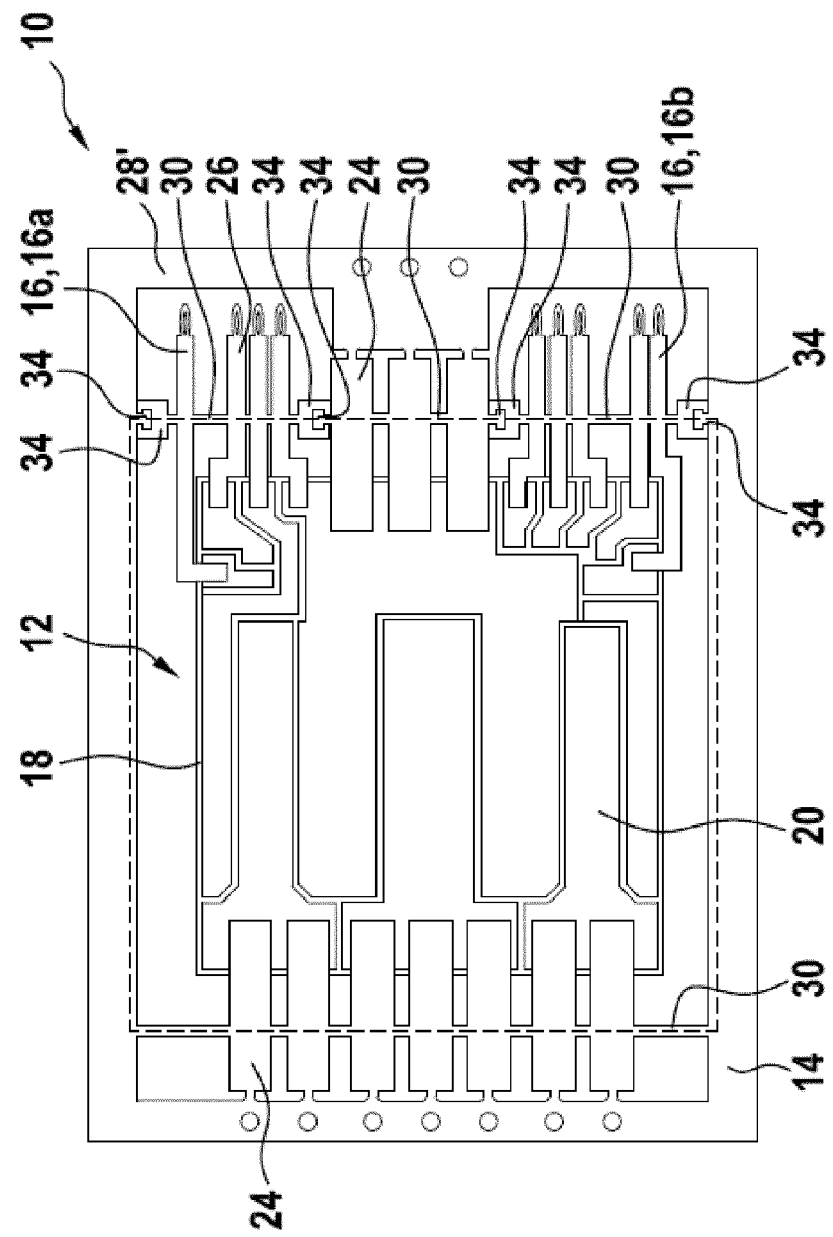
FIG. 3 shows a top view of a semi-manufactured power semiconductor module according to a further embodiment of the invention.

FIG. 3 shows a further embodiment of a semi-manufactured power semiconductor module 10, in which also the power terminals 24 on the opposite side to the auxiliary terminals 26 are fixed by interlocking elements 34 relative to the auxiliary terminals 26.

The leadframes 14a and 14b of FIG. 1 are united in one leadframe 14, which comprises a holding element 28', which encompasses all terminals 24, 26. The dam element 30 on the side opposite to the auxiliary terminals 26 is also interconnected with the holding element 28'. On the side of the auxiliary terminals 26, the holding element 28' and the power terminals 24 connected to it provide interlocking elements 34, for the leadframes 14a, 14b. In FIG. 3, the leadframes 16a, 16b are interlocked with the leadframe 14 on both sides, i.e. each of which may have two interlocking elements 34.

The leadframes 16a, 16b also comprise interlocking elements 34 and are inserted into the leadframe 14. This may have the advantage of an improved alignment accuracy between the different terminals 24, 26 and the dam elements 30 running around the entire module 10. Again, dashed lines indicates the sealing of the mold volume.

Figure 4:
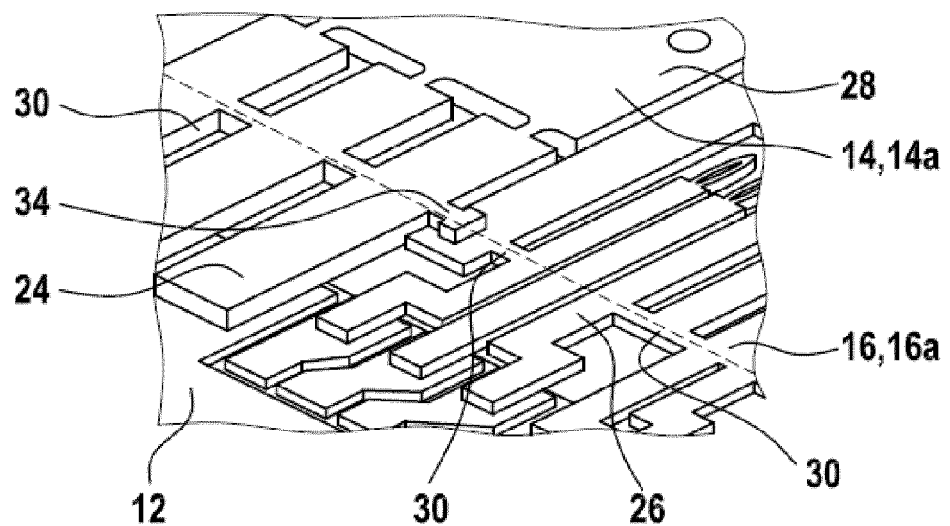
FIG. 4 shows a detail of FIG. 1 and FIG. 3 in a perspective view.

FIG. 4 shows a detail of FIG. 1 in a perspective view. The embodiment of FIG. 3 may be designed analogously. FIG. 4 shows that the interlocking element 34 with the broadened tip is a protrusion on the thicker leadframe 14 on a side of a power terminal 24. The corresponding interlocking feature with opening is provided by the thinner leadframe 16a.

Figure 5:
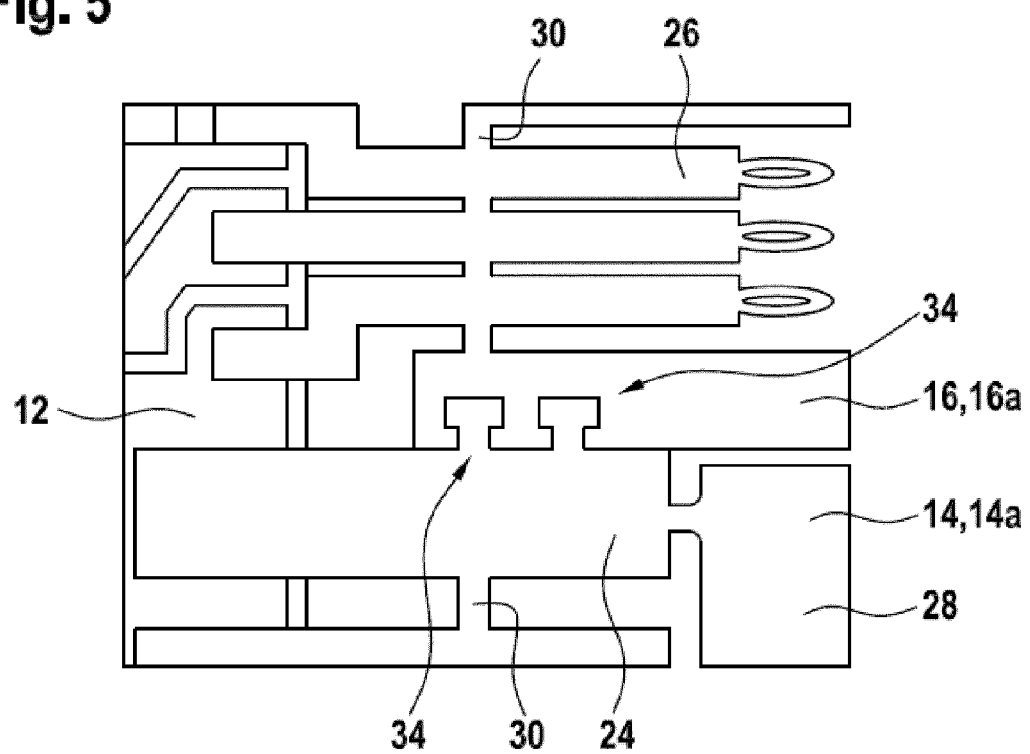
FIG. 5 shows a top view of a detail of a semi-manufactured power semiconductor module according to a further embodiment of the invention.

FIG. 5 shows a further embodiment of an interlocking element 34, which may comprise two broadened tips and a corresponding interlocking element 34, which comprises two openings for receiving the broadened tips. This may further improve the connection between the two leadframes 14, 16 and the seal provided by the interlocking elements 34.

Figure 6:
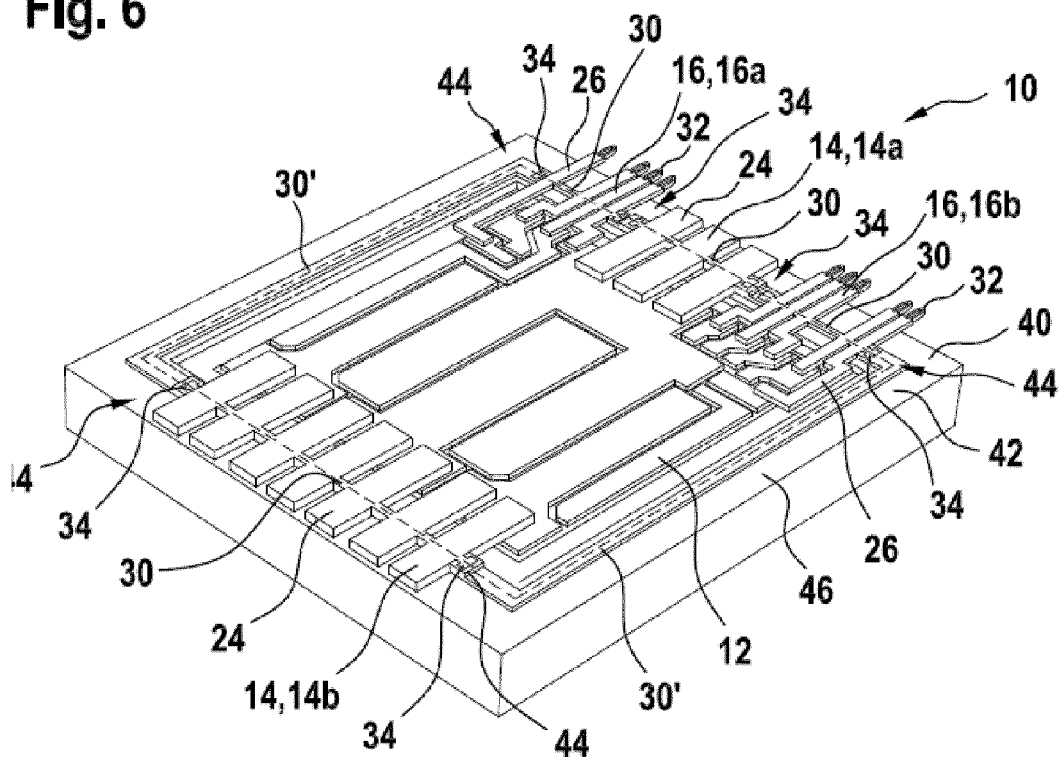
FIG. 6 shows a perspective view of a semi-manufactured power semiconductor module in a mold according to an embodiment of the invention.

FIG. 6 shows a semi-manufactured power semiconductor module 10, similar to the one shown in FIG. 1, but with differently arranged interlocking elements 34. FIG. 6 furthermore shows a first half 42 of a mold 40, into which the module 10 is inserted.

The embodiment of FIG. 6 may be combined with the holding element 28' of FIG. 3 and/or may be manufactured as described with respect to FIG. 2.

In FIG. 6, four separate leadframe parts 14a, 14b, 16a, 16b for all power and leadframe terminals 24, 26 are directly inserted into the bottom half 42 of the mold 40. To this end, the leadframes 14a, 14b, 16a, 16b all comprise interlocking elements 34, which are inserted into interlocking parts 44 of the mold 40. Again, dashed lines indicates the sealing of the mold volume.

The interlocking elements 34 on the leadframes 14a, 14b, 16a, 16b all may be provided directly on a side of an intermediate part of the outer terminals 24, 26. Analogously to FIGS. 1 to 5, the terminals may be interconnected by dam elements 30, which like the interlocking elements 34 are positioned on the border 46 of the mold half 42.

With the leadframes 14, 16 directly inserted into the mold 40, the positioning tolerance of the bonding process of the leadframes 14, 16 does not need to be summed up for two leadframes 14, 16.

The interlocking parts on the border 46 of the mold half 42 may be provided by an elevated structure, which provides dam elements 30' on the border of the mold half 42. In the ends of the dam elements 30', openings corresponding to the interlocking elements 34 provide the interlocking parts 44.

Figure 7:
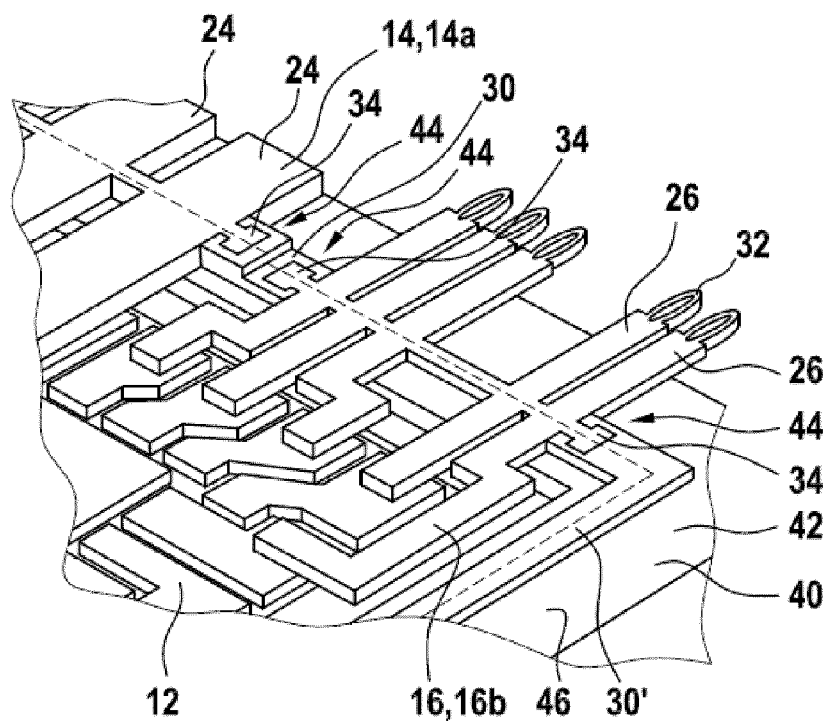
FIG. 7 shows a detail of FIG. 6.

As better seen in FIG. 7, the dam elements 30' at its ends and also the corresponding interlocking part 44 have the same heights as the thickness of the interlocked leadframe 14, 16. Steps in the dam elements 30' compensate the different thicknesses of the leadframes 14, 16. This may be advantageous because the bottom and top half 42 of the mold 40 may be manufactured and aligned with higher precision and the alignment between the steps in the two mold halves 42 may be therefore easier to achieve than alignment between steps in the mold 40 and leadframes 14, 16. Alternatively, the dam elements 30' may be beveled instead of having vertical steps to compensate the different thicknesses, which may provide a further improved sealing of the mold volume.

Figure 8:
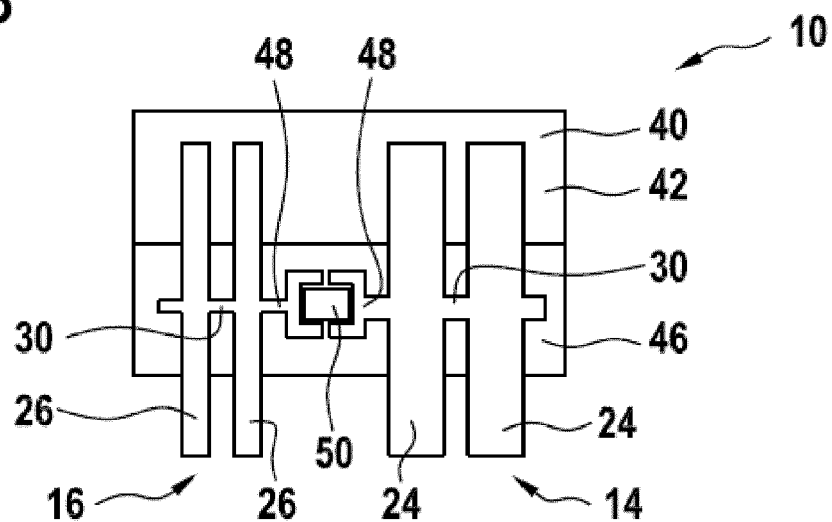
FIG. 8 schematically shows a top view of a detail of a semi-manufactured power semiconductor module according to a further embodiment of the invention.

FIG. 8 schematically shows a further embodiment of a semi-manufactured power semiconductor module 10, which may be designed like the ones shown in FIGS. 1 to 7, but with the interlocking elements 34 replaced by fork elements 48.

Two fork elements 48 provided on different leadframes 14, 16 are arranged opposite to one another. As in the case of the interlocking elements 34, the fork elements may be seen as continuations of dam element 30.

Each fork element 48 has two arms, such that the two fork element 48 embraces an opening, into which a sealing element 50, such as a rubber block, may be inserted.

Summarized, the module of FIG. 8 may comprise: a substrate 12 for bonding at least one power semiconductor chip 22; a first leadframe 14 bonded to the substrate 12 and providing power terminals 24; and a second leadframe 16 bonded to the substrate 12 and providing auxiliary terminals 26. The first leadframe 14 has a first fork element 48 pointing towards a second fork element 48 of the second leadframe 16, such that an opening between the first fork element 48 and the second fork element 48 is generated.

Figure 9:
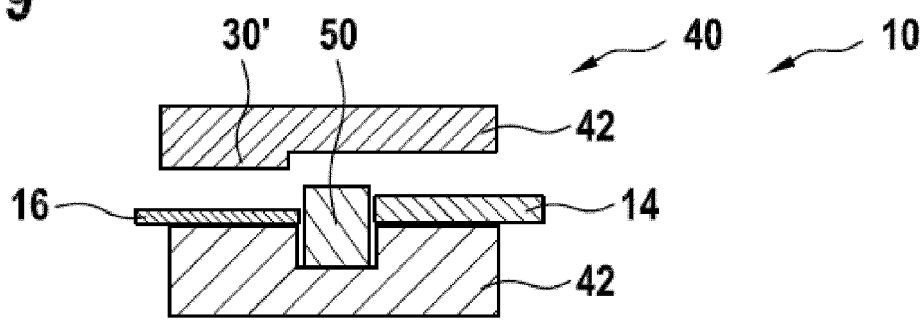
FIG. 9 schematically shows a cross-section through an opened mold with the semi-manufactured power semiconductor module of FIG. 8.
Figure 10:
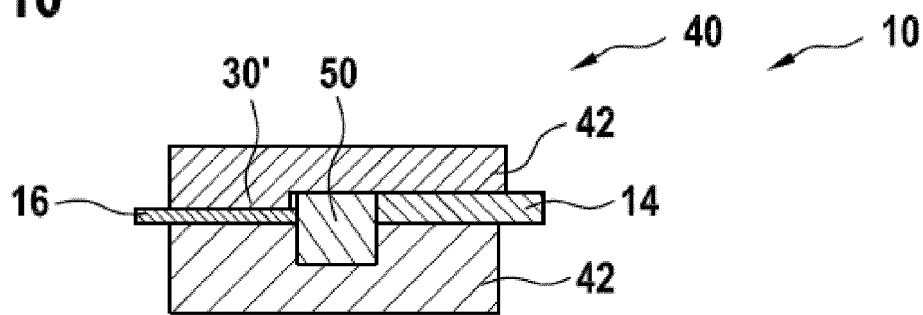
FIG. 10 schematically shows a cross-section through a closed mold with the semi-manufactured power semiconductor module of FIG. 8.

FIGS. 9 and 10 show the module 10 of FIG. 8 in an open and closed mold 40, respectively.

FIG. 9 shows that the sealing element 50 is provided in an opening in one of the mold halves 42. One of the mold halves 42 also may have a dam element 30' for compensating the different thicknesses of the leadframes 14, 16.

As shown in FIG. 10, when the mold is closed, the compressive sealing element 50 may be compressed and may completely fill out the space between the fork elements 48 and the mold halves 42 to provide a seal between the leadframes 14, 16.

A method for manufacturing the power semiconductor module 10 of FIGS. 8 to 9 may comprise: providing a substrate 12 for bonding at least one power semiconductor chip 22; bonding a first leadframe 14 and a second leadframe 16 to the substrate 12, wherein the first leadframe 14 has a first fork element 48 pointing towards a second fork element 48 of the second leadframe 16, such that an opening between the first fork element 48 and the second fork element 48 is generated; placing the substrate 12, the first leadframe 14 and the second leadframe 16 in a mold 40, such that the first fork element 48 and the second fork element 48 are positioned on a border 46 of the mold 40 and such that a sealing element 50 of the mold 40 is positioned inside the opening; and molding the substrate 12, the first leadframe 14 and the second leadframe 16 into a molding material, wherein liquid molding material is hindered by the compressed sealing element 50 from leaving the mold 40.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS

10 semi-manufactured power semiconductor module
10' power semiconductor module
12 substrate
14, 14a, 14b first leadframe
16, 16a, 16b second leadframe
18 base layer
20 metallization layer
22 semiconductor chip
24 power terminal
26 auxiliary terminal
28, 28' holding element
30, 30' dam element
32 press-fit tip
34 interlocking element
36 plating
38 encapsulation
40 mold
42 mold half
44 interlocking part
46 border
48 fork element
50 sealing element

The invention claimed is:

1. A semi-manufactured power semiconductor module, comprising:
a substrate for bonding at least one power semiconductor chip;
a first leadframe bonded to the substrate and providing power terminals, the power terminals of the first leadframe having a first thickness; and
a second leadframe bonded to the substrate and providing auxiliary terminals, the auxiliary terminals of the second leadframe having a second thickness that is different than the first thickness;
wherein the first leadframe and/or the second leadframe comprise means for aligning the first leadframe and the second leadframe with respect to each other and/or with respect to a mold for molding an encapsulation around the substrate, the first leadframe and the second leadframe.

2. The semi-manufactured power semiconductor module of claim 1, wherein the means for aligning comprises a first interlocking element of the first leadframe and a second interlocking element of the second leadframe, the second interlocking element form fitting into the first interlocking element.

3. The semi-manufactured power semiconductor module of claim 2, wherein one of the first and second interlocking elements has a broadened tip and the other one of the first and second interlocking elements has a correspondingly shaped opening.

4. The semi-manufactured power semiconductor module of claim 2, wherein the first leadframe comprises a holding element surrounding the second leadframe and an interlocking element is provided by the holding element.

5. The semi-manufactured power semiconductor module of claim 1, wherein the means for aligning comprises:
an interlocking element of the first leadframe that is adapted for being arranged in a corresponding interlocking part of the mold; and/or
an interlocking element of the second leadframe that is adapted for being arranged in a corresponding interlocking part of the mold.

6. The semi-manufactured power semiconductor module of claim 1, wherein the means for aligning is provided on a side of a power terminal and/or an auxiliary terminal.

7. The semi-manufactured power semiconductor module claim 2, wherein interlocking elements of the first leadframe and the second leadframe are arranged on a line to be covered by a border of the mold.

8. The semi-manufactured power semiconductor module of claim 2, wherein the first leadframe comprises a dam element interconnecting the power terminals, the dam element to be covered by a border of the mold; and/or
wherein the second leadframe comprises a dam element interconnecting the auxiliary terminals, the dam element to be covered by the border of the mold.

9. The semi-manufactured power semiconductor module of claim 8, wherein interlocking elements of the first leadframe and the second leadframe are provided on a line with the dam element and/or are parts of the dam element.

10. The semi-manufactured power semiconductor module of claim 1, wherein the first leadframe and the second leadframe are made of a different material.

11. The semi-manufactured power semiconductor module of claim 1, wherein the first leadframe is made from one metal sheet and/or wherein the second leadframe is made from one metal sheet.

12. The semi-manufactured power semiconductor module of claim 1, wherein at least some of the auxiliary terminals have a press-fit tip.

13. The semi-manufactured power semiconductor module according to claim 2, wherein the means for aligning comprises a plurality of interlocking element pairs, each interlocking element pair including a single first interlocking element of the first leadframe and a single second interlocking element of the second leadframe, the second interlocking element form fitting into the first interlocking element.

14. The semi-manufactured power semiconductor module of claim 2, wherein the means for aligning comprises a plurality of interlocking element pairs, each interlocking element pair including a plurality of first interlocking elements of the first leadframe and a plurality of second interlocking elements of the second leadframe, each second interlocking element form fitting into an associated one of the first interlocking elements.

15. The semi-manufactured power semiconductor module of claim 1, wherein the first leadframe is made from one metal sheet and wherein the second leadframe is made from a plurality of metal sheets.

16. The semi-manufactured power semiconductor module of claim 1, wherein the means for aligning comprises a sealing element, a first fork element of the first leadframe and a second fork element of the second leadframe.

17. The semi-manufactured power semiconductor module of claim 16, wherein the first fork element pointing toward the second fork element such that an opening is formed between the first fork element and the second fork element, the sealing element disposed in the opening.

18. A semi-manufactured power semiconductor module, comprising:
- a substrate that includes a pad portion to which a power semiconductor is to be bonded;
- a first leadframe bonded to the substrate and having power terminals of a first thickness, the first leadframe having a first interlocking element; and
- a second leadframe bonded to the substrate and having auxiliary terminals of a second thickness that is different than the first thickness, the second leadframe having a second interlocking element, the first interlocking and the second interlocking element forming a means for aligning the first leadframe and the second leadframe with respect to each other.

19. The semi-manufactured power semiconductor module of claim 18, wherein one of the first and second interlocking elements has a broadened tip and the other one of the first and second interlocking elements has an correspondingly shaped opening.

20. The semi-manufactured power semiconductor module of claim 19, wherein the power terminals and the auxiliary terminals extend in a first direction and wherein the module further comprises further power terminals extending in a second direction that is opposite the first direction.

21. The semi-manufactured power semiconductor module of claim 20, wherein each of the power terminals and further power terminals has a proximate end adjacent the pad portion and a distal end opposite the proximate end, the semi-manufactured power semiconductor module further comprising a holding element attached at the distal end of each of the power terminals.

22. The semi-manufactured power semiconductor module of claim 21, wherein the holding element extends around the substrate and is attached at the distal end of each of the further power terminals.

23. The semi-manufactured power semiconductor module of claim 21, the holding element is not attached to any of the further power terminals.

24. The semi-manufactured power semiconductor module of claim 19, further comprising a power semiconductor chip bonded to the pad portion of the substrate.

25. A semi-manufactured power semiconductor module, comprising:
- a substrate for bonding at least one power semiconductor chip;
- a first leadframe bonded to the substrate and providing power terminals and a first interlocking element, the power terminals of the first leadframe having a first thickness; and
- a second leadframe bonded to the substrate and providing auxiliary terminals and a second interlocking element, the auxiliary terminals of the second leadframe having a second thickness that is less than the first thickness, wherein the first interlocking element and the second interlocking element align the first leadframe and the second leadframe with respect to each other.

* * * * *